(12) United States Patent
Binder et al.

(10) Patent No.: US 11,391,791 B2
(45) Date of Patent: Jul. 19, 2022

(54) SENSOR DEVICE WITH AUXILIARY STRUCTURE FOR CALIBRATING THE SENSOR DEVICE

(71) Applicant: Infineon Technologies AG, Neubiberg (DE)

(72) Inventors: Gernot Binder, Klagenfurt (AT); Riccardo Dapretto, Villach (AT); Diego Lunardini, Faak am See (AT); Mario Motz, Wernberg (AT); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 61 days.

(21) Appl. No.: 16/923,583

(22) Filed: Jul. 8, 2020

(65) Prior Publication Data

US 2021/0011095 A1   Jan. 14, 2021

(30) Foreign Application Priority Data

Jul. 9, 2019   (DE) .......................... 102019118545.9

(51) Int. Cl.
*G01R 33/00*   (2006.01)

(52) U.S. Cl.
CPC ...... *G01R 33/0035* (2013.01); *G01R 33/0011* (2013.01); *G01R 33/0017* (2013.01)

(58) Field of Classification Search
CPC ................ G01R 33/00; G01R 33/0035; G01R 33/0023; G01R 33/0017; G01R 31/3191; G01R 33/0011; G01B 7/004; G01C 17/38; G06F 3/017; G06F 3/0346; G06F 3/012
See application file for complete search history.

(56) References Cited

U.S. PATENT DOCUMENTS

| 2009/0001964 A1* | 1/2009 | Strzalkowski | ....... G01R 15/181 |
| | | | 324/202 |
| 2013/0138372 A1* | 5/2013 | Ausserlechner | ..... G01R 35/005 |
| | | | 702/65 |

FOREIGN PATENT DOCUMENTS

| DE | 198 27 056 A1 | 12/1999 |
| DE | 10 2008 030 411 A1 | 1/2009 |
| DE | 10 2012 221 803 A1 | 5/2013 |

* cited by examiner

*Primary Examiner* — Jermele M Hollington
*Assistant Examiner* — Taqi R Nasir
(74) *Attorney, Agent, or Firm* — Harrity & Harrity, LLP

(57) ABSTRACT

A sensor device comprises an electrically conductive chip carrier, wherein the chip carrier comprises an auxiliary structure, wherein the auxiliary structure comprises a first precalibration current terminal and a second precalibration current terminal, a magnetic field sensor chip arranged on a mounting surface of the chip carrier, wherein the magnetic field sensor chip comprises a sensor element, wherein the shape of the auxiliary structure is embodied such that an electrical precalibration current flowing from the first precalibration current terminal to the second precalibration current terminal through the auxiliary structure induces a predefined precalibration magnetic field at the location of the sensor element, wherein during measurement operation of the precalibrated sensor device, no precalibration current flows between the first precalibration current terminal and the second precalibration current terminal.

21 Claims, 6 Drawing Sheets

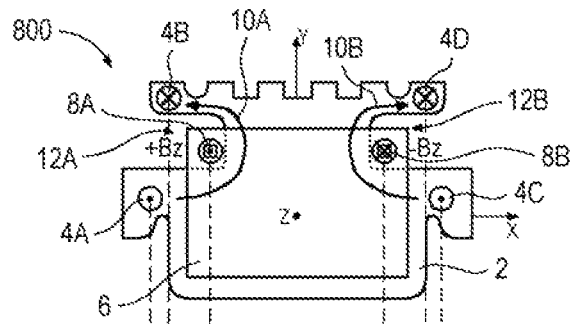
Fig. 8A
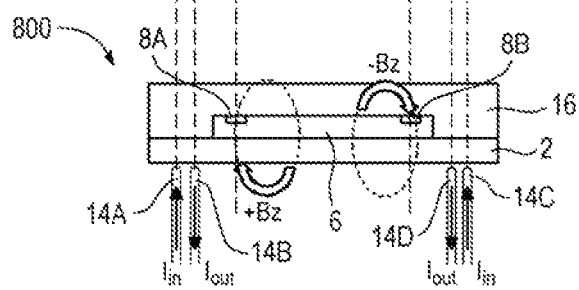
Fig. 8B
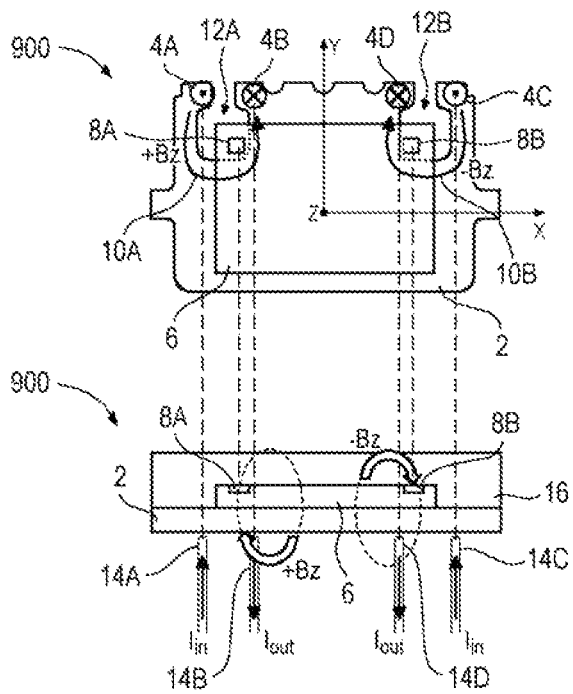
Fig. 9A
Fig. 9B

SENSOR DEVICE WITH AUXILIARY STRUCTURE FOR CALIBRATING THE SENSOR DEVICE

CROSS REFERENCE TO RELATED APPLICATION

This application claims priority to German Patent Application No. 102019118545.9 filed on Jul. 9, 2019, the content of which is incorporated by reference herein in its entirety.

TECHNICAL FIELD

The present disclosure relates generally to sensor devices. For example, the disclosure relates to sensor devices with auxiliary structures for calibrating the sensor devices.

BACKGROUND

Sensor devices can react sensitively to temperature changes, moisture and mechanical stresses. In order to achieve a high measurement accuracy of the sensor devices, at the end of their production it is possible to carry out a calibration in order to compensate for the effects mentioned. A magnetic field used for the calibration can be generated for example by an electrical current flowing through an external busbar.

BRIEF SUMMARY

Various aspects relate to a sensor device, comprising an electrically conductive chip carrier, wherein the chip carrier comprises an auxiliary structure, wherein the auxiliary structure comprises a first precalibration current terminal and a second precalibration current terminal, a magnetic field sensor chip arranged on a mounting surface of the chip carrier, wherein the magnetic field sensor chip comprises a sensor element, wherein the shape of the auxiliary structure is embodied such that an electrical precalibration current flowing from the first precalibration current terminal to the second precalibration current terminal through the auxiliary structure induces a predefined precalibration magnetic field at the location of the sensor element, wherein during measurement operation of the precalibrated sensor device, no precalibration current flows between the first precalibration current terminal and the second precalibration current terminal.

Various aspects relate to a sensor device, comprising a chip carrier, a magnetic field sensor chip arranged on the chip carrier, wherein the magnetic field sensor chip comprises at least one sensor element, an encapsulation material, wherein the chip carrier and the magnetic field sensor chip are at least partly encapsulated by the encapsulation material, and a current line arranged on the magnetic field sensor chip, wherein the shape of the current line is embodied such that an electrical current flowing through the current line induces a predefined magnetic field at the location of the sensor element.

BRIEF DESCRIPTION OF THE DRAWINGS

Sensor devices and methods for calibrating sensor devices in accordance with the disclosure are explained in greater detail below with reference to drawings. The elements shown in the drawings are not necessarily rendered in a manner true to scale relative to one another. Identical reference signs may designate identical components.

FIGS. 8A and 8B schematically show a plan view and a cross-sectional side view of a sensor device 800.

FIGS. 9A and 9B schematically show a plan view and a cross-sectional side view of a sensor device 900.

FIG. 16A shows a frequency dependence of the differential magnetic field and FIG. 16B shows a frequency dependence of the phase shift of the magnetic field.

DETAILED DESCRIPTION

Figure 1:
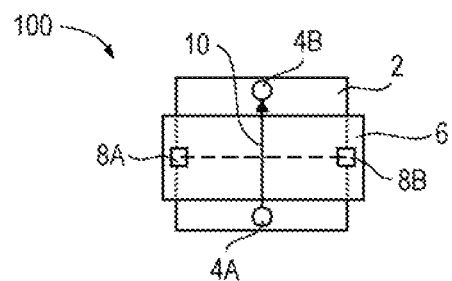
FIG. 1 schematically shows a plan view of a sensor device 100 in accordance with the disclosure.

FIG. 1 schematically shows a plan view of a sensor device 100 in accordance with the disclosure. The sensor device 100 is illustrated in a general way in order to describe aspects of the disclosure qualitatively. The sensor device 100 can have further aspects, which are not illustrated in FIG. 1 for the sake of simplicity. For example, the sensor device 100 can be extended by any desired aspects described in connection with other sensor devices in accordance with the disclosure. Explanations concerning FIG. 1 can equally apply to other sensor devices in accordance with the disclosure from among those described herein.

The sensor device 100 can comprise an electrically conductive chip carrier 2. The chip carrier 2 can be produced from copper, nickel, aluminum or high-grade steel, for example. In one example, the chip carrier 2 can be a leadframe having a diepad and terminal conductors (not illustrated). The chip carrier 2 can comprise an auxiliary structure having a first precalibration current terminal 4A and a second precalibration current terminal 4B. The sensor device 100 can furthermore comprise a magnetic field sensor chip 6 arranged on a mounting surface of the chip carrier 2, wherein the magnetic field sensor chip 6 can comprise at least one sensor element. In the example in FIG. 1, the magnetic field sensor chip 6 can comprise two sensor elements 8A and 8B. In a further example, the magnetic field sensor chip 6 can comprise only a single sensor element. The shape of the auxiliary structure can be embodied such that an electrical precalibration current 10 flowing from the first precalibration current terminal 6A to the second precalibration current terminal 6B through the auxiliary structure induces a predefined precalibration magnetic field at the location of the sensor elements 8A, 8B.

The auxiliary structure of the sensor device 100 can correspond to the chip carrier 2 or to an artificial busbar which is formed by the chip carrier 2 and which runs from the first precalibration current terminal 4A to the second precalibration current terminal 4B. The course of the artificial busbar or the current path of the precalibration current 10 relative to the sensor elements 8A, 8B can arise here in particular as a result of the geometric shape of the chip carrier 2 and/or the arrangement of the precalibration current terminals 4A, 4B. In measurement operation of the precalibrated sensor device 100, it may be the case that no precalibration current 10 flows between the first precalibration current terminal 4A and the second precalibration current terminal 4B.

In the example plan view in FIG. 1, the chip carrier 2 can have a rectangular shape. In this case, the corresponding side edges of the chip carrier 2 and of the magnetic field sensor chip 6 can be oriented substantially parallel to one another. The sensor elements 8A, 8B can be arranged at the mutually opposite left and right side edges of the magnetic field sensor chip 6. The precalibration current terminals 4A, 4B can be arranged at the mutually opposite upper and lower side edges of the chip carrier 2. A connecting line between the sensor elements 8A, 8B and a connecting line between the precalibration current terminals 4A, 4B can run substantially perpendicular to one another in this case.

The precalibration current terminals 4A, 4B and the sensor elements 8A, 8B can be arranged relative to one another in such a way that the precalibration current 10 flowing from the first precalibration current terminal 4A to the second precalibration current terminal 4B follows a current path that runs between the sensor elements 8A, 8B. In other words, the current path can cross an imaginary connecting line running from the first sensor element 8A to the second sensor element 8B. Thus, the first precalibration current terminal 4A can be arranged below the imaginary connecting line, while the second precalibration current terminal 4B can be arranged above the imaginary connecting line. In the example in FIG. 1, the rectilinear current path of the precalibration current 10 can be regarded as a section of a circle of infinite radius running around the first sensor element 8A in the counterclockwise direction and also as a section of a circle of infinite radius running around the second sensor element 8B in the clockwise direction.

In the example in FIG. 1, each of the sensor elements 8A, 8B can correspond to a Hall sensor element. The magnetic field sensor chip 6 can thus be a differential Hall magnetic field sensor chip, in particular. The precalibration current 10 can induce a precalibration magnetic field at the location of the first sensor element 8A and at the location of the second sensor element 8B. In this case, the precalibration magnetic field at the location of the first sensor element 8A can be directed oppositely to the precalibration magnetic field at the location of the second sensor element 8B. In the example in FIG. 1, the precalibration magnetic field can be directed out of the plane of the drawing at the location of the first sensor element 8A and be directed into the plane of the drawing at the location of the second sensor element 8B. The precalibration current 10 can thus induce a defined differential precalibration magnetic field at the locations of the sensor elements 8A, 8B. In the plan view in FIG. 1, the auxiliary structure or the current course of the precalibration current 10 and the sensor elements 8A, 8B can be in each case (at least partly) free of overlap. This makes it possible to ensure that the induced magnetic field at the location of the sensor elements 8A, 8B has a component perpendicular to the respective Hall sensor element. In one example, the auxiliary structure and the sensor elements 8A, 8B can be in each case completely free of overlap. In a further example, the auxiliary structure and the sensor elements 8A, 8B can overlap in each case to the extent of a small portion. In this case, the auxiliary structure and the sensor elements 8A, 8B can be at least 80% or at least 85% or at least 90% or at least 95% free of overlap.

The auxiliary structure of the chip carrier 2 can be used to carry out a calibration of the sensor device 100. During the calibration, the precalibration current 10 can be fed into the first precalibration current terminal 4A at different current frequencies and/or at different temperatures (and thus with different mechanical stresses of an encapsulation material possibly present). For each current frequency and/or each temperature, the current flowing from the first precalibration current terminal 4A to the second precalibration current terminal 4B can generate a predefined or defined precalibration magnetic field that can be detected by the sensor elements 8A, 8B. The measurement results of the sensor device 100 can be recorded and an offset of the measurement values recorded can be eliminated. Eliminating the offset makes it possible to provide a constant sensitivity of the sensor device 100 over the current frequency range under consideration and/or the temperature range under consideration.

The calibration described can be carried out at the end of the process of manufacturing the sensor device 100. In particular, the calibration can be carried out after the components of the sensor device 100 have been encapsulated by an encapsulation material, such that effects caused by mechanical stresses of the encapsulation material already are taken into account in the calibration. It should be noted that a calibration of the sensor device 100 can be carried out even with an opposite course of the precalibration current 10, e.g. from the second precalibration current terminal 4B to the first precalibration current terminal 4A. The same applies to calibrations of the further sensor devices in accordance with the disclosure as described herein.

The magnetic field sensor chip 6 can be arranged on the chip carrier 2 during an assembly process, in particular. Positioning tolerances of a few micrometers can be achieved in such an assembly process. That means that the sensor elements 8A, 8B can be positioned with a corresponding accuracy relative to the source of the induced precalibration magnetic field (e.g. relative to the auxiliary structure), such that a correspondingly accurate calibration can be carried out. In contrast thereto, only positioning accuracies of hundreds of micrometers can be achieved with use of conventional external magnetic field sources (e.g. external solenoids or external busbars). A calibration of sensor devices in accordance with the disclosure can thus be more accurate by one or more orders of magnitude compared with conventional calibration processes. Furthermore, a positioning of the magnetic field sensor chip and of the sensor elements thereof relative to the magnetic field source during a calibration in accordance with the disclosure can be constant over the different temperatures. In contrast thereto, in the case where the magnetic field is generated externally, it may be necessary to position the magnetic field sensor chip anew for each individual temperature, as a result of which the positioning error can repeatedly change.

The described calibration of the sensor device 100 can be carried out during or at the end of manufacture of the sensor device 100. After such a calibration, the precalibrated sensor device 100 can operate in measurement operation. In this case, by way of example, a measurement magnetic field induced by a measurement current can be detected by the sensor device 100. During measurement operation of the precalibrated sensor device 100, it may be the case that no precalibration current 10 flows between the first precalibration current terminal 4A and the second precalibration current terminal 4B. In other words, it may be the case that the precalibration current terminals 4A, 4B are not designed to be used for or during measurement operation of the precalibrated sensor device 100. The precalibration current terminals 4A, 4B may rather be designed exclusively to be used for a calibration of the sensor device 100. In this regard, in one example, a measurement magnetic field induced by a measurement current at the location of the sensor elements 8A, 8B may be one or more orders of magnitude stronger than a precalibration magnetic field induced by the precalibration current 10. In a further example, the strengths of the induced measurement magnetic field and of the induced precalibration magnetic field may be of an identical order of magnitude. In yet another example, the induced measurement magnetic field may even be weaker than the induced precalibration magnetic field. It should be noted that a calibration of the finished produced sensor device 100 may still be possible even in the case of high measurement currents. However, during such a subsequent calibration, a current flow no longer takes place via the precalibration current terminals 4A, 4B of the auxiliary structure.

Figure 2:
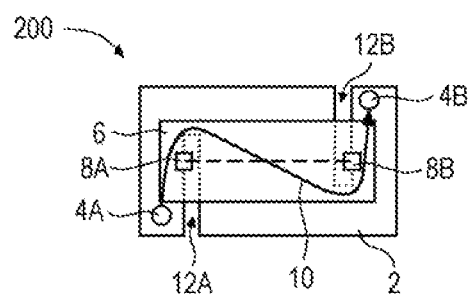
FIG. 2 schematically shows a plan view of a sensor device 200 in accordance with the disclosure.

FIG. 2 schematically shows a plan view of a sensor device 200 in accordance with the disclosure. The sensor device 200 can be at least partly similar to the sensor device 100 from FIG. 1. In contrast to FIG. 1, the chip carrier 2 or the auxiliary structure can have two notches 12A, 12B. In the example in FIG. 2, the first notch 12A beginning from the lower side edge of the chip carrier 2 can extend into the chip carrier 2 and in this case run substantially parallel to the left and right side edges of the chip carrier 2. The second notch 12B beginning from the upper side edge of the chip carrier 2 can extend into the chip carrier 2 and have a similar shape. In the plan view in FIG. 2, the first notch 12A and the first sensor element 8A and also the second notch 12B and the second sensor element 8B can be in each case at least partly free of overlap.

A precalibration current 10 that is fed into the auxiliary structure and flows from the first precalibration terminal 4A to the second precalibration terminal 4B can flow along a current path running around the notches 12A, 12B. In the plan view in FIG. 2, the current path can have an S-shaped course, wherein the first sensor element 8A and the second sensor element 8B can each be arranged within the S-shaped course. Analogously to the example in FIG. 1, the precalibration current 10 at the locations of the sensor elements 8A, 8B can generate a defined differential precalibration magnetic field, on the basis of which a calibration of the sensor device 200 can be carried out.

The notches 12A, 12B can interrupt an electron flow that can be induced in the chip carrier 2 by magnetic fields that occur. This interruption makes it possible to suppress a formation of eddy currents in the chip carrier 2 at high current frequencies. When chip carriers having notches are used, an increased frequency bandwidth can thus be provided. An influence of eddy currents on a magnetic field measurement for the case of leadframes with or without notches is illustrated and discussed in FIGS. 16A and 16B.

Figure 3:
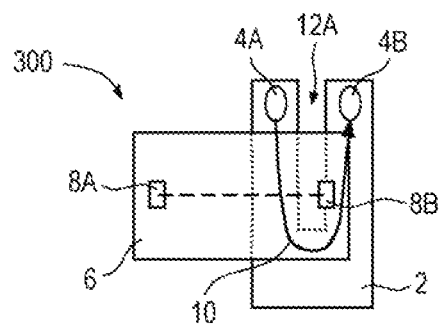
FIG. 3 schematically shows a plan view of a sensor device 300 in accordance with the disclosure.

FIG. 3 schematically shows a plan view of a sensor device 300 in accordance with the disclosure. In the example in FIG. 3, the chip carrier 2 can have a notch 12A which, beginning from the upper side edge of the chip carrier 2, extends into the chip carrier 2. In the plan view in FIG. 3, the chip carrier 2 can be embodied in a U-shaped fashion. In the example shown, the U-shape can have right angles. In further examples, the U-shape of the chip carrier 2 can be rounded. The shape of the auxiliary structure of the sensor device 300 can accordingly be embodied such that the precalibration current 10 likewise has a U-shaped course. In this case, the first sensor element 8A can be arranged outside the U-shaped course of the auxiliary structure and the second sensor element 8B can be arranged within the U-shaped course of the auxiliary structure. In the example in FIG. 3, the first sensor element 8A and the auxiliary structure can be completely free of overlap, while the second sensor element 8B and the auxiliary structure at least partly overlap.

Figure 4:
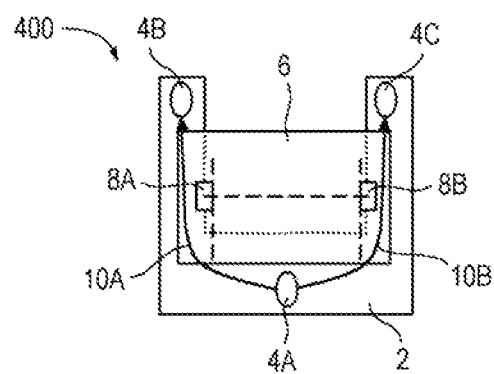
FIG. 4 schematically shows a plan view of a sensor device 400 in accordance with the disclosure.

FIG. 4 schematically shows a plan view of a sensor device 400 in accordance with the disclosure. In the example in FIG. 4, the auxiliary structure of the sensor device 400 can have three precalibration current terminals 4A to 4C. For the calibration of the sensor device 400, a first precalibration current 10A can flow from the first precalibration current terminal 4A to the second precalibration current terminal 4B and a second precalibration current 10B can flow from the first precalibration current terminal 4A to the third precalibration current terminal 4C. It should be noted that a calibration of the sensor device 400 can also be carried out with precalibration currents 10A, 10B having opposite courses.

The chip carrier 2 can be embodied in a U-shaped fashion. As a result, the auxiliary structure of the sensor device 400 can be shaped such that the first precalibration current 10A runs around the first sensor element 8A and induces a predefined first precalibration magnetic field at the location of the first sensor element 8A. In a similar manner, the second precalibration current 10B can run around the second sensor element 8B and induce a predefined second precalibration magnetic field at the location of the second sensor element 8B. The first precalibration magnetic field and the second precalibration magnetic field can have opposite directions.

Figure 5:
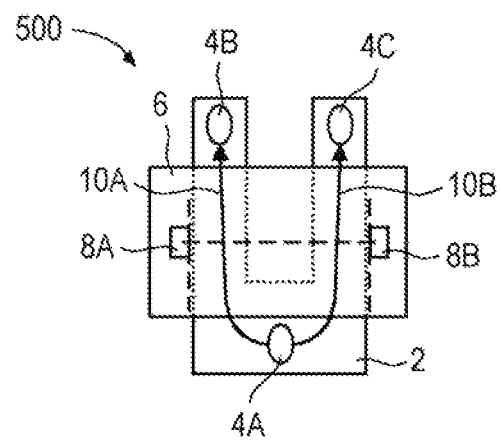
FIG. 5 schematically shows a plan view of a sensor device 500 in accordance with the disclosure.

FIG. 5 schematically shows a plan view of a sensor device 500 in accordance with the disclosure. The sensor device 500 can be at least partly similar to the sensor device 400 from FIG. 4. In contrast to FIG. 4, the auxiliary structure of the sensor device 500 can be embodied such that both sensor elements 8A, 8B lie outside the courses of the precalibration currents 10A, 10B.

Figure 6:
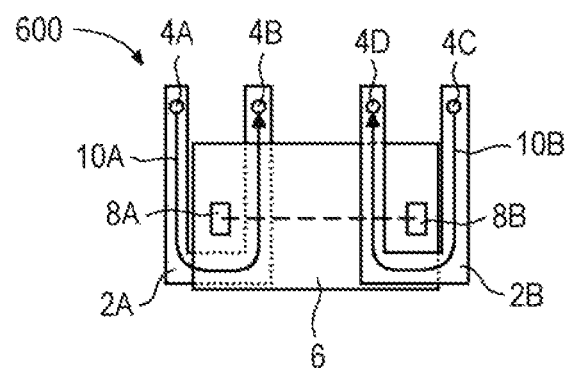
FIG. 6 schematically shows a plan view of a sensor device 600 in accordance with the disclosure.

FIG. 6 schematically shows a plan view of a sensor device 600 in accordance with the disclosure. In the example in FIG. 6, the auxiliary structure can have four precalibration current terminals 4A to 4D. For the calibration of the sensor device 600, a first precalibration current 10A can flow from the first precalibration current terminal 4A to the second precalibration current terminal 4B and a second precalibration current 10B can flow from the third precalibration current terminal 4C to the fourth precalibration current terminal 4D. The chip carrier can have two parts 2A and 2B, which can each be embodied in a U-shaped fashion. Accordingly, the shape of the auxiliary structure can be embodied such that the first precalibration current 10A runs around the first sensor element 8A in a U-shaped fashion and induces a predefined first precalibration magnetic field at the location of the first sensor element 8A. In a similar manner, the second precalibration current 10B can run around the second sensor element 8B in a U-shaped fashion and induce a predefined second precalibration magnetic field at the location of the second sensor element 8B. The first precalibration magnetic field and the second precalibration magnetic field can have opposite directions in this case, such that a defined differential precalibration magnetic field is generated at the locations of the sensor elements 8A, 8B, on the basis of which precalibration magnetic field a calibration of the sensor device 600 can be carried out.

Figure 7:
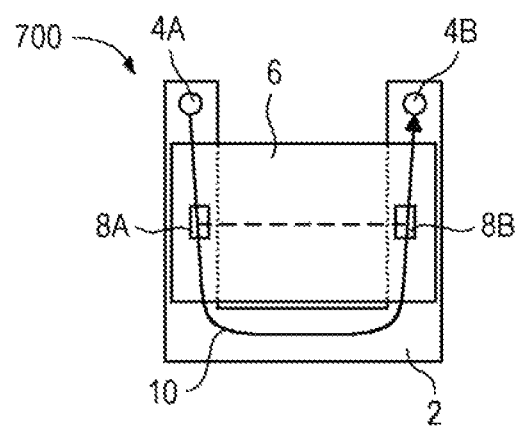
FIG. 7 schematically shows a plan view of a sensor device 700 in accordance with the disclosure.

FIG. 7 schematically shows a plan view of a sensor device 700 in accordance with the disclosure. In the previous examples in FIGS. 1 to 6, each of the sensor elements 8A, 8B could correspond to a Hall sensor element, in particular. In contrast thereto, the sensor elements 8A, 8B of the sensor device 700 can correspond in each case to a magnetoresistive sensor element or to a vertical Hall sensor element or to a fluxgate sensor element. The sensor elements 8A, 8B can be for example magnetoresistive xMR sensor elements, in particular AMR sensor elements, GMR sensor elements or TMR sensor elements. Since the sensor elements mentioned can be sensitive in particular with respect to an "in-plane" magnetic field component, the sensor elements 8A, 8B can be aligned with the artificial busbar formed by the chip carrier 2 or with the course of the precalibration current 10. In other words, the sensor elements 8A, 8B can be arranged directly over the course of the precalibration current 10. That is to say that, in the plan view in FIG. 7, the auxiliary structure and the sensor elements 8A, 8B can in each case completely overlap.

FIGS. 8A and 8B schematically show a plan view and a cross-sectional side view of a sensor device 800. The sensor device 800 can comprise a chip carrier 2 and a magnetic field sensor chip 6 arranged on the upper mounting surface of the chip carrier 2. In the example in FIGS. 8A and 8B, the chip carrier 2 and the magnetic field sensor chip 6 can be arranged in the x-y-plane. The magnetic field sensor chip 6 can have two sensor elements 8A, 8B, which can be arranged in the top left and top right corner, respectively of the magnetic field sensor chip 6 in the plan view in FIG. 8A. It is possible for the sensor elements 8A, 8B and the auxiliary structure or the chip carrier 2 not to overlap in the plan view. The sensor elements 8A, 8B can be Hall sensor elements, in particular, which can form a differential magnetic field sensor.

The chip carrier 2 can have an auxiliary structure having four precalibration current terminals 4A to 4D. By way of example, the chip carrier 2 can be a leadframe having a plurality of terminal conductors 14A to 14D. In this case, the precalibration current terminals 4A to 4D can respectively comprise one of the terminal conductors 14A to 14D or be electrically connected thereto. The chip carrier 2 can have a first notch 12A in the upper region of the left side edge of the chip carrier 2 and a second notch 12B in the upper region of the right side edge of the chip carrier 2.

During a calibration of the sensor device 800, a first precalibration current can be fed into the auxiliary structure of the chip carrier 2 via the first terminal conductor 14A and the first precalibration current terminal 4A (cf. $I_{in}$). On account of the shape and arrangement of the first notch 12A, the first precalibration current 10A can flow around the first notch 12A and leave the chip carrier 2 via the second precalibration terminal 4B and the second terminal conductor 14B (cf. $I_{out}$). In a similar manner, a second precalibration current can be fed into the auxiliary structure of the chip carrier 2 via the third terminal conductor 14C and the third precalibration current terminal 4C (cf. $I_{in}$). On account of the arrangement of the second notch 12B, the second precalibration current 10B can flow around the second notch 12B and leave the chip carrier 2 via the fourth precalibration terminal 4D and the fourth terminal conductor 14D (cf. $I_{out}$).

The first precalibration current 10A can induce a precalibration magnetic field having a component in the positive z-direction (cf. +Bz) at the location of the first sensor element 8A. In a similar manner, the second precalibration current 10B can induce a precalibration magnetic field having a component in the negative z-direction (cf. −Bz) at the location of the second sensor element 8B. The course of the precalibration currents 10A, 10B through the auxiliary structure makes it possible to generate a defined differential magnetic field at the locations of the sensor elements 8A, 8B, which magnetic field can be used for a calibration of the sensor device 800.

The sensor device 800 can comprise an encapsulation material 16. The chip carrier 2 and the magnetic field sensor chip 6 can be at least partly encapsulated by the encapsulation material 16. The terminal conductors 14A to 14D can project at least partly from the encapsulation material 16, such that the precalibration currents 10A, 10B can be fed into the auxiliary structure of the sensor device 800 from outside the encapsulation material 16. The package formed by the encapsulation material 16 can be a so-called TDSO package for example.

FIGS. 9A and 9B schematically show a plan view and a cross-sectional side view of a sensor device 900. The sensor device 900 can be at least partly similar to the sensor device 800 from FIGS. 8A and 8B. In contrast to FIGS. 8A and 8B, the notches 12A, 12B of the sensor device 900 can be arranged in the left and right regions, respectively of the upper side edge of the chip carrier 2.

Figure 10A:
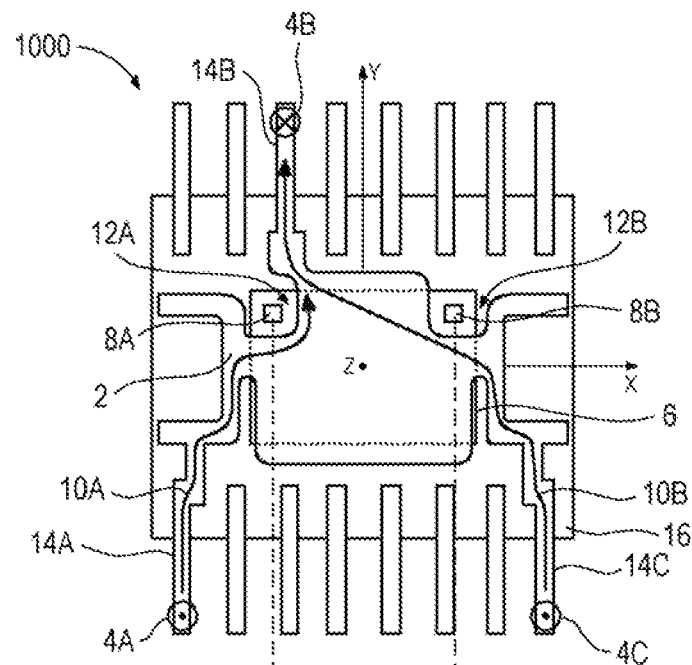
FIGS. 10A and 10B schematically show a plan view and a cross-sectional side view of a sensor device 1000.
Figure 10B:
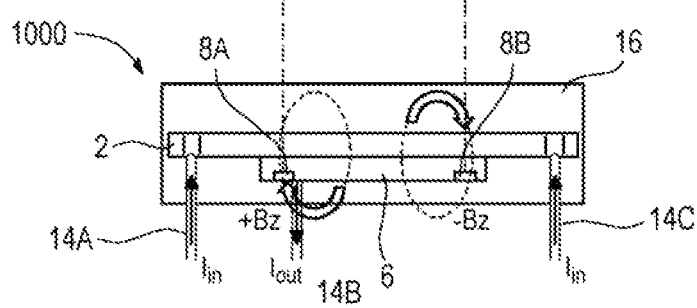

FIGS. 10A and 10B schematically show a plan view and a cross-sectional side view of a sensor device 1000. In the example in FIGS. 10A and 10B, the chip carrier 2 can have a mounting surface in the form of a diepad and a multiplicity of terminal conductors 14. The magnetic field sensor chip 6 can be arranged for example on an underside of the diepad. The chip carrier 2 can have two notches 12A, 12B, such that the sensor elements 8A, 8B do not overlap the chip carrier 2 in the plan view in FIG. 10A. The auxiliary structure of the sensor device 1000 can have three precalibration current terminals 4A to 4C in the form of three terminal conductors 14A to 14C. The terminal conductors 14A to 14C can be test pins or so-called pogopins, for example.

During a calibration of the sensor device 1000, a first precalibration current can be fed into the auxiliary structure of the chip carrier 2 via the first terminal conductor 14A at the first precalibration current terminal 4A. On account of the arrangement and shape of the first notch 12A, a first precalibration current 10A can run around the first notch 12A and leave the chip carrier 2 at the second precalibration terminal 4B via the second terminal conductor 14B. In a similar manner, a second precalibration current 10B can be fed into the auxiliary structure of the chip carrier 2 via the third terminal conductor 14C at the third precalibration current terminal 4C. On account of the arrangement and shape of the second notch 12B, the second precalibration current 10B can run around the second notch 12B and likewise leave the chip carrier 2 at the second precalibration terminal 4B via the second terminal conductor 14B. Analogously to the examples described above, the precalibration currents 10A, 10B can generate a defined differential magnetic field at the locations of the sensor elements 8A, 8B, which magnetic field can be used for the calibration of the sensor device 1000.

In the plan views in FIGS. 1 to 6 and 8 to 10, the sensor elements 8A, 8B and the auxiliary structure could be arranged (at least partly) free of overlap. Such an arrangement free of overlap can be used particularly in the case of Hall sensor elements or a differential Hall magnetic field sensor chip. In this context, it should be noted that the examples of the figures mentioned can be adapted for the case of magnetoresistive sensor elements or vertical Hall sensor elements or fluxgate sensor elements by the sensor elements 8A, 8B being aligned with the current courses of the precalibration currents. Here the magnetoresistive sensor elements or vertical Hall sensor elements or fluxgate sensor elements can be arranged in each case directly above or directly below the corresponding current path, e.g. the auxiliary structure and the respective sensor element can completely overlap in the respective plan view.

Figure 11:
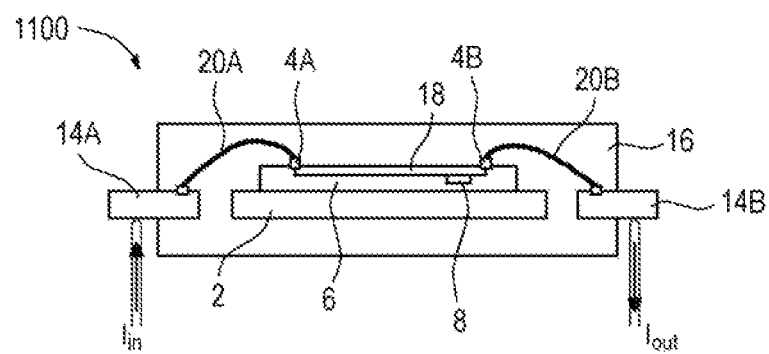
FIG. 11 schematically shows a cross-sectional side view of a sensor device 1100 in accordance with the disclosure.

FIG. 11 schematically shows a cross-sectional side view of a sensor device 1100 in accordance with the disclosure. The sensor device 1100 can comprise a chip carrier 2 having a diepad and terminal conductors 14A, 14B. A magnetic field sensor chip 6 can be arranged on a mounting surface of the chip carrier 2, which magnetic field sensor chip can have at least one sensor element 8. By way of example, the magnetic field sensor chip 6 can be a differential magnetic field sensor chip having two sensor elements. The chip carrier 2 and the magnetic field sensor chip 6 can be at least partly encapsulated by an encapsulation material 16. In this case, the terminal conductors 14A, 14B can at least partly project from the encapsulation material 16 in order that the magnetic field sensor chip 6 can be electrically contacted from outside the encapsulation material 16.

Figure 12:
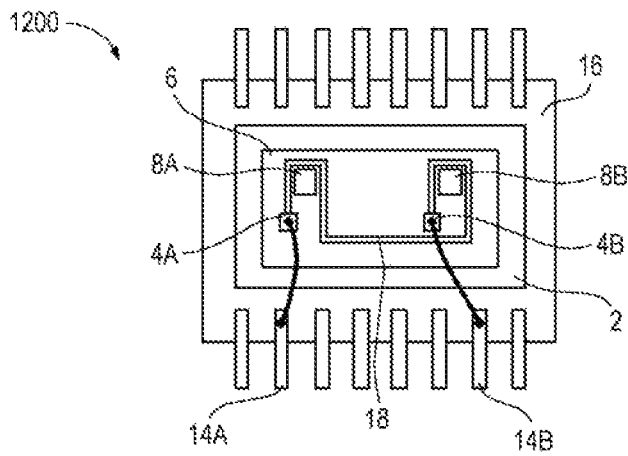
FIG. 12 schematically shows a plan view of a sensor device 1200 in accordance with the disclosure.
Figure 13:
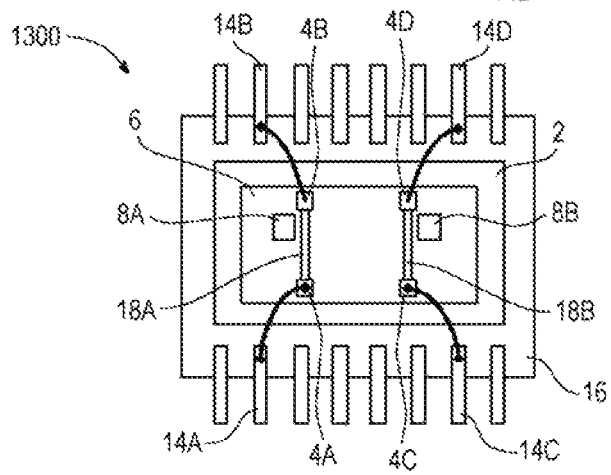
FIG. 13 schematically shows a plan view of a sensor device 1300 in accordance with the disclosure.

A current line 18 can be arranged on the magnetic field sensor chip 6. In the example in FIG. 11, the current line 18 can be arranged on a surface of the magnetic field sensor chip 6 facing away from the chip carrier 2. The shape of the current line 18 can be embodied such that an electrical current flowing through the current line 18 induces a predefined magnetic field at the location of the sensor element(s) 8. Example shapes or courses of the current line 18 are shown in FIGS. 12 and 13. The current line 18 can have a first precalibration current terminal 4A at a first end and a second precalibration current terminal 4B at a second end. The precalibration current terminals 4A, 4B can be electrically connected to the terminal conductors 14A, 14B via connecting elements 20A, 20B. In the example in FIG. 11, the connecting elements 20A, 20B are illustrated in the form of connecting wires. In further examples, the connecting elements 20A, 20B can be clips and/or tapes. It should be noted that previous explanations contained in FIGS. 1 to 10 can also be applied to the sensor device 1100 in FIG. 11. In this context, the auxiliary structure in FIGS. 1 to 10 can be identified or equated with the current line 18 in FIG. 11.

The current line 18 can be used to carry out a calibration of the sensor device 1100. During the calibration, a precalibration current can be fed into the current line 18 via the first terminal conductor 14A, the first connecting element 20A and the first precalibration current terminal 4A at different current frequencies and/or at different temperatures (cf. $I_{in}$). The precalibration current flowing through the current line 18 can generate a defined precalibration magnetic field at the location of the at least one sensor element 8, on the basis of which precalibration magnetic field the calibration can be performed. In this case, for the sake of simplicity, reference is made to corresponding explanations in connection with FIG. 1. The precalibration current can leave the sensor device 1100 via the second precalibration current terminal 4B, the second connecting element 20B and the second terminal conductor 14B (cf. $I_{out}$).

The described calibration of the sensor device 1100 can be carried out for example after manufacture of the sensor device 1100 has been concluded. In particular, the calibration can be carried out after the components of the sensor device 1100 have already been encapsulated by the encapsulation material 16. Effects caused by stresses of the encapsulation material 16 can thus be taken into account in the calibration.

FIG. 12 schematically shows a plan view of a sensor device 1200 in accordance with the disclosure. The sensor device 1200 can be similar to the sensor device 1100 from FIG. 11 and shows a more detailed course of the current line 18 on the surface of the magnetic field sensor chip 6. The magnetic field sensor chip 6 can have two sensor elements 8A, 8B. By way of example, the magnetic field sensor chip 6 can be a differential Hall magnetic field sensor chip. The current line 18 can run around the first sensor element 8A in the clockwise direction, such that the precalibration current flowing through the current line 18 can induce a precalibration magnetic field pointing into the plane of the drawing. In a similar manner, the current line 18 can run around the second sensor element 8B in the counterclockwise direction, such that the precalibration current can induce a precalibration field pointing out of the plane of the drawing. A rectangular course of the current line 18 around the sensor elements 8A, 8B is shown in each case in the example in FIG. 11. In further examples, the current line 18 can also be guided around the sensor elements 8A, 8B in a round or oval shape.

FIG. 13 schematically shows a plan view of a sensor device 1300 in accordance with the disclosure. The sensor device 1300 can comprise four precalibration current terminals 4A to 4D. A first precalibration current can flow through a first current line 18A from the first precalibration current terminal 4A to the second precalibration current terminal 4B and generate a first precalibration magnetic field at the location of the first sensor element 8A. In a similar manner, a second precalibration current can flow through a second current line 18B from the third precalibration current terminal 4C to the fourth precalibration current terminal 4D and generate a second precalibration magnetic field at the location of the second sensor element 8B.

Figure 14:
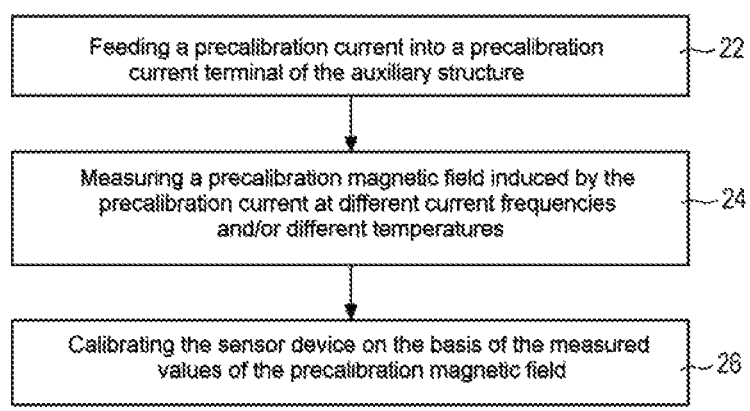
FIG. 14 shows a flow diagram of a method for calibrating a sensor device in accordance with the disclosure.

FIG. 14 shows a flow diagram of a method for calibrating a sensor device in accordance with the disclosure. By way of example, each of the sensor devices described here can be calibrated in accordance with the method of FIG. 14. The method can thus be read in association with each of FIGS. 1 to 13.

At 22, at least one precalibration current can be fed into at least one precalibration current terminal of the auxiliary structure. At 24, at least one precalibration magnetic field induced by the precalibration current can be measured at different current frequencies and/or at different temperatures. At 26, the sensor device can be calibrated on the basis of the measured values of the at least one precalibration magnetic field. Calibrating the sensor device can be carried out in particular after encapsulating the chip carrier and the magnetic field sensor chip by an encapsulation material.

Figure 15:
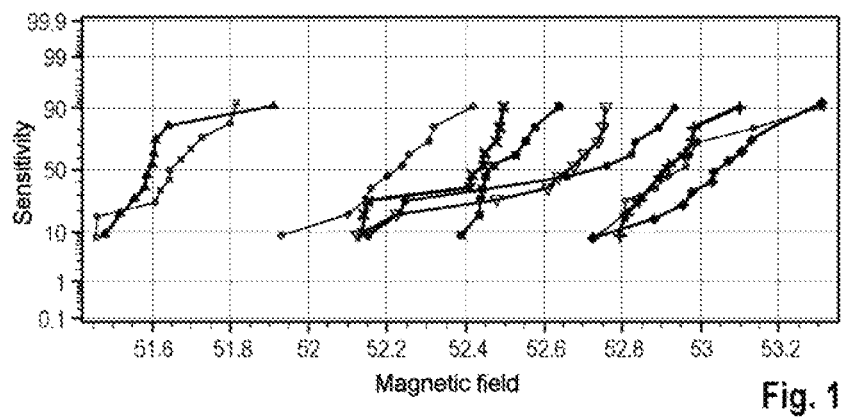
FIG. 15 shows a diagram illustrating the sensitivities of ten sensor device prototypes in accordance with the disclosure.

FIG. 15 shows a diagram illustrating the sensitivities of ten sensor device prototypes in accordance with the disclosure. In this case, the sensitivity is plotted against a differential magnetic field measured at the prototypes. The diagram in FIG. 15 is based on measurements at ten protypes using automated test equipment (ATE) at room temperature. Ten measurements were carried out for each prototype.

Accordingly, FIG. 15 illustrates ten curves, each resulting from ten measurement values. Each of the curves can be assigned to one of the prototypes. For each prototype, different measurement values result on account of the signal noise and a limited measurement accuracy. It is evident from the curves of the ten prototypes that the part-to-part variation of the sensitivity of the prototypes at room temperature is less than 5%.

Figure 16A:
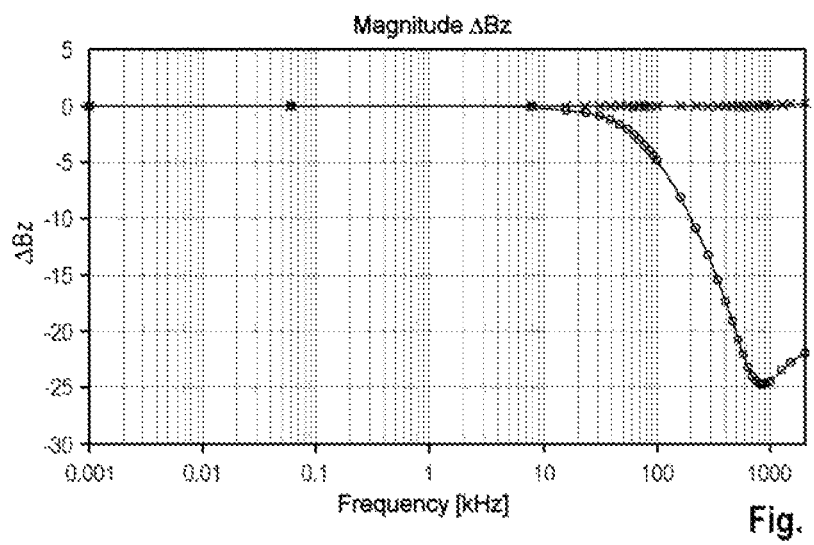
FIGS. 16A and 16B illustrate the influence of eddy currents on a magnetic field measurement by sensor devices having a leadframe with or without notches. In this case.
Figure 16B:
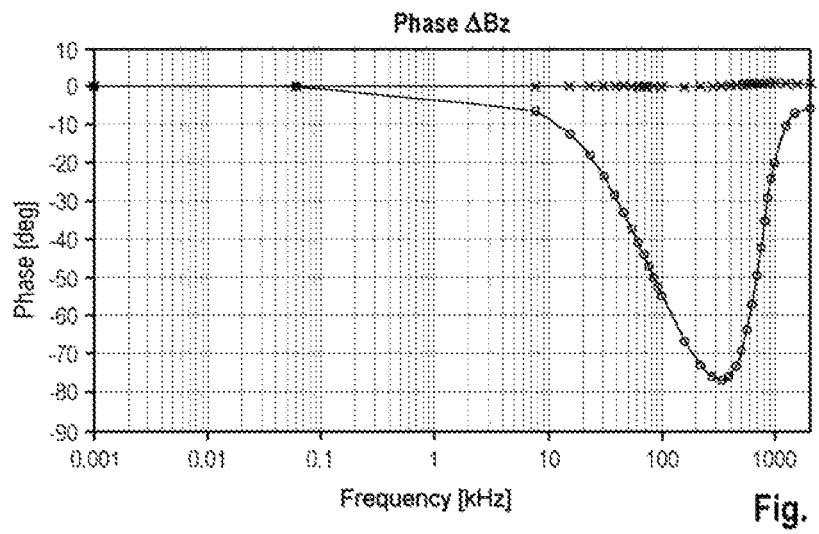

FIGS. 16A and 16B illustrate the influence of eddy currents on a magnetic field measurement by sensor devices comprising a leadframe with or without notches. One example leadframe with notches is shown in FIGS. 9A and 9B. The results for the scenario of a leadframe without notches are represented by small circles, while the results for the scenario of a leadframe with notches are represented by small crosses. FIG. 16A shows a frequency dependence of the differential magnetic field, wherein the difference between the magnetic field strength measured at a left Hall sensor element and the magnetic field strength measured at a right Hall sensor element is plotted against the current frequency in kHz. FIG. 16B shows a frequency dependence of the phase shift of the magnetic field, wherein the phase shift in degrees is plotted against the current frequency in kHz.

It is evident from FIGS. 16A and 16B that in the scenario of a leadframe with notches, there is no attenuation up to a frequency value of approximately 2 MHz. The notches can interrupt an electron flow and thus suppress the formation of eddy currents at high frequencies. In contrast thereto, a signal drop and a phase shift can be observed in the case of the leadframe without notches. Comparison of the two scenarios reveals that an increased bandwidth can be present in the case of a leadframe with notches.

EXAMPLES

Sensor devices and methods for calibrating sensor devices are explained below on the basis of examples.

Example 1 is a sensor device, comprising: an electrically conductive chip carrier, wherein the chip carrier comprises an auxiliary structure, wherein the auxiliary structure comprises a first precalibration current terminal and a second precalibration current terminal; a magnetic field sensor chip arranged on a mounting surface of the chip carrier, wherein the magnetic field sensor chip comprises a first sensor element, wherein the shape of the auxiliary structure is embodied such that a first electrical precalibration current flowing from the first precalibration current terminal to the second precalibration current terminal through the auxiliary structure induces a predefined first precalibration magnetic field at the location of the first sensor element, wherein during measurement operation of the precalibrated sensor device, no precalibration current flows between the first precalibration current terminal and the second precalibration current terminal.

Example 2 is a sensor device according to example 1, wherein a measurement magnetic field induced by a measurement current at the location of the first sensor element is orders of magnitude stronger than the first precalibration magnetic field induced by the first precalibration current.

Example 3 is a sensor device according to example 1 or 2, wherein: the auxiliary structure comprises a notch, and the first precalibration current flows along a current path running around the notch.

Example 4 is a sensor device according to any of the preceding examples, wherein: the first sensor element comprises a Hall sensor element, and in a view perpendicular to the mounting surface of the chip carrier, the auxiliary structure and the first sensor element are free of overlap.

Example 5 is a sensor device according to any of examples 1 to 3, wherein: the first sensor element comprises a magnetoresistive sensor element or a vertical Hall sensor element or a fluxgate sensor element, and in a view perpendicular to the mounting surface of the chip carrier, the auxiliary structure and the first sensor element completely overlap.

Example 6 is a sensor device according to any of the preceding examples, wherein the magnetic field sensor chip is a differential magnetic field sensor chip and comprises a second sensor element.

Example 7 is a sensor device according to example 6, wherein the first precalibration current induces a precalibration magnetic field at the location of the second sensor element, wherein the precalibration magnetic field at the location of the second sensor element is directed oppositely to the precalibration magnetic field at the location of the first sensor element.

Example 8 is a sensor device according to example 6 or 7, wherein: in a view perpendicular to the mounting surface of the chip carrier, the first precalibration current flows along a current path, and the current path crosses an imaginary connecting line from the first sensor element to the second sensor element.

Example 9 is a sensor device according to any of examples 6 to 8, wherein: the shape of the auxiliary structure is embodied such that the first precalibration current has an S-shaped course in a view perpendicular to the mounting surface of the chip carrier, and the first sensor element and the second sensor element are arranged in the S-shaped course.

Example 10 is a sensor device according to any of examples 6 to 8, wherein: the shape of the auxiliary structure is embodied such that the first precalibration current has a U-shaped course in a view perpendicular to the mounting surface of the chip carrier, the first sensor element is arranged within the U-shaped course, and the second sensor element is arranged outside the U-shaped course.

Example 11 is a sensor device according to example 6, wherein: the auxiliary structure comprises a third precalibration current terminal, and the shape of the auxiliary structure is embodied such that a second precalibration current flowing from the first precalibration current terminal to the third precalibration current terminal through the auxiliary structure induces a predefined second precalibration magnetic field at the location of the second sensor element, and the first precalibration magnetic field and the second precalibration magnetic field have opposite directions.

Example 12 is a sensor device according to example 11, wherein the shape of the auxiliary structure is embodied such that in a view perpendicular to the mounting surface of the chip carrier, the first precalibration current has a course around the first sensor element and the second precalibration current has a course around the second sensor element.

Example 13 is a sensor device according to example 11, wherein: the shape of the auxiliary structure is embodied such that the first precalibration current and the second precalibration current each have a course in a view perpendicular to the mounting surface of the chip carrier, and the first sensor element and the second sensor element lie outside the courses.

Example 14 is a sensor device according to example 6, wherein: the auxiliary structure comprises a third precalibration current terminal and a fourth precalibration current terminal, and the shape of the auxiliary structure is embodied such that a further precalibration current flowing from the third precalibration current terminal to the fourth precalibration current terminal through the auxiliary structure induces a further precalibration magnetic field at the location of the second sensor element.

Example 15 is a sensor device according to example 14, wherein: the shape of the auxiliary structure is embodied such that in a view perpendicular to the mounting surface of the chip carrier, the first precalibration current has a first U-shaped course and the further precalibration current has a further U-shaped course, and the first sensor element lies within the first U-shaped course and the second sensor element lies within the further U-shaped course.

Example 16 is a sensor device according to any of the preceding examples, wherein: the chip carrier comprises a leadframe having a plurality of terminal conductors, and the first precalibration current terminal and the second precalibration current terminal each comprise a terminal conductor of the leadframe.

Example 17 is a sensor device according to any of the preceding examples, furthermore comprising: an encapsulation material, wherein the chip carrier and the magnetic field sensor chip are at least partly encapsulated by the encapsulation material.

Example 18 is a method for calibrating a sensor device according to any of the preceding examples, wherein the method comprises: feeding at least one precalibration current into at least one precalibration current terminal of the auxiliary structure; measuring at least one precalibration magnetic field induced by the precalibration current at different current frequencies and/or at different temperatures; and calibrating the sensor device on the basis of the measured values of the at least one precalibration magnetic field.

Example 19 is a method according to example 18, wherein the calibrating is carried out after encapsulating the chip carrier and the magnetic field sensor chip by an encapsulation material.

Example 20 is a sensor device, comprising: a chip carrier; a magnetic field sensor chip arranged on the chip carrier, wherein the magnetic field sensor chip comprises at least one sensor element; an encapsulation material, wherein the chip carrier and the magnetic field sensor chip are at least partly encapsulated by the encapsulation material; and a current line arranged on the magnetic field sensor chip, wherein the shape of the current line is embodied such that an electrical current flowing through the current line induces a predefined magnetic field at the location of the sensor element.

Example 21 is a sensor device according to example 20, wherein: the chip carrier comprises a leadframe having a terminal conductor projecting from the encapsulation material, and the terminal conductor is designed to the effect that an electrical current is fed into the current line via the terminal conductor.

Although specific implementations have been illustrated and described herein, it is apparent to a person of average skill in the art that a multiplicity of alternative and/or equivalent implementations can replace the specific implementations shown and described, without departing from the scope of the present disclosure. This application is intended to cover all adaptations or variations of the specific implementation discussed herein. Therefore, the intention is for this disclosure to be restricted only by the claims and the equivalents thereof.

The invention claimed is:

1. A sensor device, comprising:
an electrically conductive chip carrier, wherein the electrically conductive chip carrier comprises an auxiliary structure, wherein the auxiliary structure comprises a first precalibration current terminal and a second precalibration current terminal; and
a magnetic field sensor chip arranged on a mounting surface of the electrically conductive chip carrier, wherein the magnetic field sensor chip comprises a first sensor element,
wherein a shape of the auxiliary structure is configured such that a first electrical precalibration current flowing from the first precalibration current terminal to the second precalibration current terminal through the auxiliary structure induces a first precalibration magnetic field at a location of the first sensor element, and
wherein during measurement operation of the sensor device, no precalibration current flows between the first precalibration current terminal and the second precalibration current terminal.

2. The sensor device as claimed in claim 1, wherein a measurement magnetic field induced by a measurement current at the location of the first sensor element is orders of magnitude stronger than the first precalibration magnetic field induced by the first electrical precalibration current.

3. The sensor device as claimed in claim 1, wherein:
the auxiliary structure comprises a notch, and
the first electrical precalibration current flows along a current path running around the notch.

4. The sensor device as claimed in claim 1, wherein:
the first sensor element comprises a Hall sensor element, and
in a view perpendicular to the mounting surface of the electrically conductive chip carrier, the auxiliary structure and the first sensor element are free of overlap.

5. The sensor device as claimed in claim 1, wherein:
the first sensor element comprises a magnetoresistive sensor element or a vertical Hall sensor element or a fluxgate sensor element, and
in a view perpendicular to the mounting surface of the electrically conductive chip carrier, the auxiliary structure and the first sensor element completely overlap.

6. The sensor device as claimed in claim 1, wherein the magnetic field sensor chip is a differential magnetic field sensor chip and comprises a second sensor element.

7. The sensor device as claimed in claim 6, wherein the first electrical precalibration current induces a second precalibration magnetic field at a location of the second sensor element, wherein the second precalibration magnetic field at the location of the second sensor element is directed oppositely to the first precalibration magnetic field at the location of the first sensor element.

8. The sensor device as claimed in claim 6, wherein:
in a view perpendicular to the mounting surface of the electrically conductive chip carrier, the first electrical precalibration current flows along a current path, and
the current path crosses an imaginary connecting line from the first sensor element to the second sensor element.

9. The sensor device as claimed in claim 6, wherein:
the shape of the auxiliary structure is configured such that the first electrical precalibration current has an S-shaped course in a view perpendicular to the mounting surface of the electrically conductive chip carrier, and the first sensor element and the second sensor element are arranged in the S-shaped course.

10. The sensor device as claimed in claim 6, wherein:
the shape of the auxiliary structure is configured such that the first electrical precalibration current has a U-shaped course in a view perpendicular to the mounting surface of the electrically conductive chip carrier,
the first sensor element is arranged within the U-shaped course, and
the second sensor element is arranged outside the U-shaped course.

11. The sensor device as claimed in claim 6, wherein:
the auxiliary structure comprises a third precalibration current terminal, and
the shape of the auxiliary structure is configured such that a second precalibration current flowing from the first precalibration current terminal to the third precalibration current terminal through the auxiliary structure induces a second precalibration magnetic field at a location of the second sensor element, and
the first precalibration magnetic field and the second precalibration magnetic field have opposite directions.

12. The sensor device as claimed in claim 11, wherein the shape of the auxiliary structure is configured such that in a view perpendicular to the mounting surface of the electrically conductive chip carrier, the first electrical precalibration current has a course around the first sensor element and the second precalibration current has a course around the second sensor element.

13. The sensor device as claimed in claim 11, wherein:
the shape of the auxiliary structure is configured such that the first electrical precalibration current and the second precalibration current each have a course in a view perpendicular to the mounting surface of the electrically conductive chip carrier, and
the first sensor element and the second sensor element lie outside each course.

14. The sensor device as claimed in claim 6, wherein:
the auxiliary structure comprises a third precalibration current terminal and a fourth precalibration current terminal, and
the shape of the auxiliary structure is configured such that a further precalibration current flowing from the third precalibration current terminal to the fourth precalibration current terminal through the auxiliary structure induces a further precalibration magnetic field at a location of the second sensor element.

15. The sensor device as claimed in claim 14, wherein:
the shape of the auxiliary structure is configured such that in a view perpendicular to the mounting surface of the electrically conductive chip carrier, the first electrical precalibration current has a first U-shaped course and the further precalibration current has a further U-shaped course, and
the first sensor element lies within the first U-shaped course and the second sensor element lies within the further U-shaped course.

16. The sensor device as claimed in claim 1, wherein:
the electrically conductive chip carrier comprises a leadframe having a plurality of terminal conductors, and
the first precalibration current terminal and the second precalibration current terminal each comprise a terminal conductor of the leadframe.

17. The sensor device as claimed in claim 1, furthermore comprising:
an encapsulation material, wherein the electrically conductive chip carrier and the magnetic field sensor chip are at least partly encapsulated by the encapsulation material.

18. A method for calibrating the sensor device as claimed in claim 1, wherein the method comprises:
feeding at least one precalibration current into at least one precalibration current terminal of the auxiliary structure;
measuring at least one precalibration magnetic field induced by the precalibration current at at least one of different current frequencies or at different temperatures; and
calibrating the sensor device based on measured values of the at least one precalibration magnetic field.

19. The method as claimed in claim 18, wherein the calibrating is carried out after encapsulating the electrically conductive chip carrier and the magnetic field sensor chip by an encapsulation material.

20. A sensor device, comprising:
a chip carrier comprising a plurality of terminal conductors;
a magnetic field sensor chip arranged on the chip carrier, wherein the magnetic field sensor chip comprises at least one sensor element;
an encapsulation material, wherein the chip carrier and the magnetic field sensor chip are at least partly encapsulated by the encapsulation material; and
a current line, arranged on the magnetic field sensor chip, electrically connected to the plurality of terminal conductors via connectors, wherein a shape of the current line is configured such that an electrical current flowing through the current line induces a magnetic field at a location of the sensor element.

21. The sensor device as claimed in claim 20, wherein:
the chip carrier comprises a leadframe having a terminal conductor projecting from the encapsulation material, and
the terminal conductor is configured to feed an electrical current into the current line via the terminal conductor.

* * * * *